(12) United States Patent
Yoo et al.

(10) Patent No.: US 11,569,331 B2
(45) Date of Patent: Jan. 31, 2023

(54) DISPLAY DEVICE INCLUDING A SINGLE LAYER UPPER PAD OF A CONNECTION PAD AND METHOD FOR MANUFACTURING DISPLAY DEVICE

(71) Applicant: Samsung Display Co., LTD., Yongin-si (KR)

(72) Inventors: Young Hoon Yoo, Asan-si (KR); Kang-Woo Kim, Seoul (KR); Kyung Hoon Park, Suwon-si (KR); Yong Jae Jang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 163 days.

(21) Appl. No.: 16/951,615

(22) Filed: Nov. 18, 2020

(65) Prior Publication Data

US 2021/0249497 A1 Aug. 12, 2021

(30) Foreign Application Priority Data

Feb. 7, 2020 (KR) ........................ 10-2020-0014989

(51) Int. Cl.
| | |
|---|---|
| *H01L 27/32* | (2006.01) |
| *H01L 51/00* | (2006.01) |
| *H01L 51/56* | (2006.01) |
| *G09G 3/3208* | (2016.01) |

(52) U.S. Cl.
CPC ...... *H01L 27/3276* (2013.01); *H01L 51/0017* (2013.01); *H01L 51/56* (2013.01); *G09G 3/3208* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 2013/0082990 A1* | 4/2013 | Her | ........................ G09G 5/00 345/206 |
| 2015/0171152 A1* | 6/2015 | Choi | ................... H01L 27/3262 438/157 |
| 2016/0020422 A1* | 1/2016 | Kim | ........................ H01L 29/45 257/40 |
| 2016/0351652 A1* | 12/2016 | Kim | ..................... H01L 27/3279 |
| 2018/0323244 A1* | 11/2018 | Im | ....................... H01L 51/5228 |

(Continued)

FOREIGN PATENT DOCUMENTS

| | | |
|---|---|---|
| KR | 10-1002470 | 12/2010 |
| KR | 10-2015-0109012 | 10/2015 |

(Continued)

*Primary Examiner* — J. E. Schoenholtz
(74) *Attorney, Agent, or Firm* — Kile Park Reed & Houtteman PLLC (57) ABSTRACT

A display device includes a pixel array disposed in a display area, a connection pad disposed in a pad area, and a transfer wiring electrically connected to the connection pad to transfer a signal to the pixel array. The pixel array includes a light-emitting element including a first electrode including a multi-layered structure including a metal layer and a metal oxide layer, an organic light-emitting layer disposed on the first electrode, and a second electrode disposed on the organic light-emitting layer. The connection pad includes an upper pad conductive layer having a single-layered structure including a metal oxide.

21 Claims, 9 Drawing Sheets

(56) References Cited

U.S. PATENT DOCUMENTS

2019/0097161 A1\* 3/2019 Im .................. H01L 51/5228
2021/0020721 A1\* 1/2021 Kwack ............. H01L 27/3272
2021/0134923 A1\* 5/2021 Kim ................. H01L 27/3258

FOREIGN PATENT DOCUMENTS

| KR | 10-2016-0007407 | | 1/2016 | | |
| KR | 10-1863153 | | 6/2018 | | |
| KR | 10-2019-0064991 | | 6/2019 | | |
| KR | 20210052700 | A * | 5/2021 | ......... | H01L 27/3278 |

\* cited by examiner

DISPLAY DEVICE INCLUDING A SINGLE LAYER UPPER PAD OF A CONNECTION PAD AND METHOD FOR MANUFACTURING DISPLAY DEVICE

CROSS-REFERENCE TO RELATED APPLICATION(S)

This application claims priority to and benefits of Korean Patent Application No. 10-2020-0014989 under 35 U.S.C. § 119, filed in the Korean Intellectual Property Office on Feb. 7, 2020, the entire contents of which are incorporated herein by reference.

BACKGROUND

1. Technical Field

Embodiments relate to a display device and a method for manufacturing a display device.

2. Description of the Related Art

Generally, a display device may include a display panel and a driver providing a driving signal to the display panel. The driver may be included in a driving chip, which may be bonded to a connection pad of the display panel, or may be electrically connected to the connection pad through a flexible printed circuit board or the like.

The connection pad may include at least one conductive layer. In case that the conductive layer is damaged or corroded, reliability of the display device may be deteriorated.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide a display device with improved reliability.

Embodiments may provide a method for manufacturing a display device.

According to an embodiment, a display device may include a pixel array disposed in a display area, a connection pad disposed in a pad area, and a transfer wiring electrically connected to the connection pad to transfer a signal to the pixel array. The pixel array may include a light-emitting element including a first electrode including a multi-layered structure including a metal layer and a metal oxide layer, an organic light-emitting layer disposed on the first electrode, and a second electrode disposed on the organic light-emitting layer. The connection pad may include an upper pad conductive layer having a single-layered structure including a metal oxide.

In an embodiment, the signal may include at least one of a diving signal and a power voltage.

In an embodiment, the connection pad may further include a lower pad conductive layer disposed under the upper pad conductive layer, the lower pad conductive layer including copper.

In an embodiment, the connection pad may further include an intermediate pad conductive layer disposed between the upper pad conductive layer and the lower pad conductive layer.

In an embodiment, the intermediate pad conductive layer may include at least one selected from the group of titanium and a metal oxide.

In an embodiment, the metal layer of the first electrode may include silver.

In an embodiment, the upper pad conductive layer may include at least one selected from the group of indium tin oxide, indium zinc oxide, zinc tin oxide, indium oxide, zinc oxide and tin oxide.

In an embodiment, the display device may further include an insulation layer disposed under the upper pad conductive layer, and the insulation layer may include an inorganic material.

In an embodiment, the display device may further include a driver bonded to the connection pad.

In an embodiment, the connection pad may be electrically connected to the driver by a conductive bonding part.

According to an embodiment, a display device may include a pixel array disposed in a display area, and a connection pad disposed in a pad area and electrically connected to the pixel array. The pixel array may include a light-emitting element including a first electrode including a multi-layered structure including a metal layer and a metal oxide layer, an organic light-emitting layer disposed on the first electrode, and a second electrode disposed on the organic light-emitting layer. The connection pad may include a lower pad conductive layer including copper, and an upper pad conductive layer disposed on the lower pad conductive layer. The upper pad conductive layer may have a single-layered structure including a metal oxide.

In an embodiment, the connection pad may further include an intermediate pad conductive layer disposed between the upper pad conductive layer and the lower pad conductive layer.

In an embodiment, the intermediate pad conductive layer may include at least one selected from the group of titanium and a metal oxide.

According to an embodiment, a method for manufacturing display device is provided. The display device may include a pixel array disposed in a display area and a connection pad disposed in a pad area. The method may include forming a first electrode layer in the display area and the pad area. The first electrode layer may include a lower layer including a metal oxide, an intermediate layer including a metal, and an upper layer including a metal oxide. The method may include forming a first photoresist pattern on the first electrode layer in the pad area. The method may include forming a second photoresist pattern on the first electrode layer in the display area, and a thickness of the second photoresist pattern may be greater than a thickness of the first photoresist pattern. The method may include etching the first electrode layer to form a first remaining pattern under the first photoresist pattern and a second remaining pattern under the second photoresist pattern. The first and second remaining patterns respectively may include a lower layer, an intermediate layer and an upper layer. The method may include removing the first photoresist pattern and a portion of the second photoresist pattern to form a remaining photoresist pattern. The method may include removing an upper layer and an intermediate layer of the first remaining pattern, and removing the remaining photoresist pattern.

In an embodiment, the second remaining pattern may define a first electrode of the light-emitting element, and the lower layer of the first remaining pattern may define an upper conductive pad layer of the connection pattern.

In an embodiment, the method may further include forming a source metal pattern including a lower pad conductive layer, a source electrode and a drain electrode before forming the first electrode layer, the lower pad conductive layer may be electrically connected to the upper conductive pad layer, and the drain electrode may be electrically connected to the first electrode.

In an embodiment, the source metal pattern may include copper.

In an embodiment, the method may further include forming a connection electrode pattern including an intermediate pad conductive layer and a connection electrode after forming the source metal pattern, wherein the intermediate pad conductive layer may electrically contact the lower pad conductive layer and the upper pad conductive layer, and the connection electrode may electrically contact the drain electrode and the first electrode.

In an embodiment, the connection electrode pattern may include at least one selected from the group of titanium and a metal oxide.

In an embodiment, the lower layer of the first remaining pattern may include at least one selected from the group of indium tin oxide, indium zinc oxide, zinc tin oxide, indium oxide, zinc oxide and tin oxide.

In an embodiment, the metal layer of the first electrode layer may include silver.

According to the embodiments, a portion of an anode layer may remain in a pad area to protect a pattern disposed under a remaining pattern. Furthermore, a metal layer having a relatively low corrosion resistance may be removed in an area where a connection pad may be exposed. Thus, it may be prevented that reliability of a display device may be reduced by corrosion of the connection pad.

BRIEF DESCRIPTION OF THE DRAWINGS

Aspects of one or more embodiments of the inventive concept will be more clearly understood from the following detailed description taken in conjunction with the accompanying drawings.

DETAILED DESCRIPTION OF THE EMBODIMENTS

A display device and a method for manufacturing a display device according to embodiments of the inventive concept will be described hereinafter with reference to the accompanying drawings, in which some embodiments are shown.

As used herein, the singular forms "a," "an," and "the" are intended to include the plural forms as well, unless the context clearly indicates otherwise. When a component or the like is referred to as being "on", "connected to", or "coupled to" another component, it can be directly disposed/ connected/coupled on/to the component, or an intervening third component may also be present.

Terms such as "comprises", "has", "include", and the like specify the presence of stated features or components, but do not preclude the presence or addition of one or more other features or components.

The term "overlap" may include "layer", "stack", "face" or "facing", "extending over", "extending under", "covering" or "partly covering" or any other suitable term as would be appreciated and understood by those of ordinary skill in the art.

The phrase "at least one of" is intended to include the meaning of "at least one selected from the group of" for the purpose of its meaning and interpretation. For example, "at least one of A and B" may be understood to mean "A, B, or A and B."

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 1:
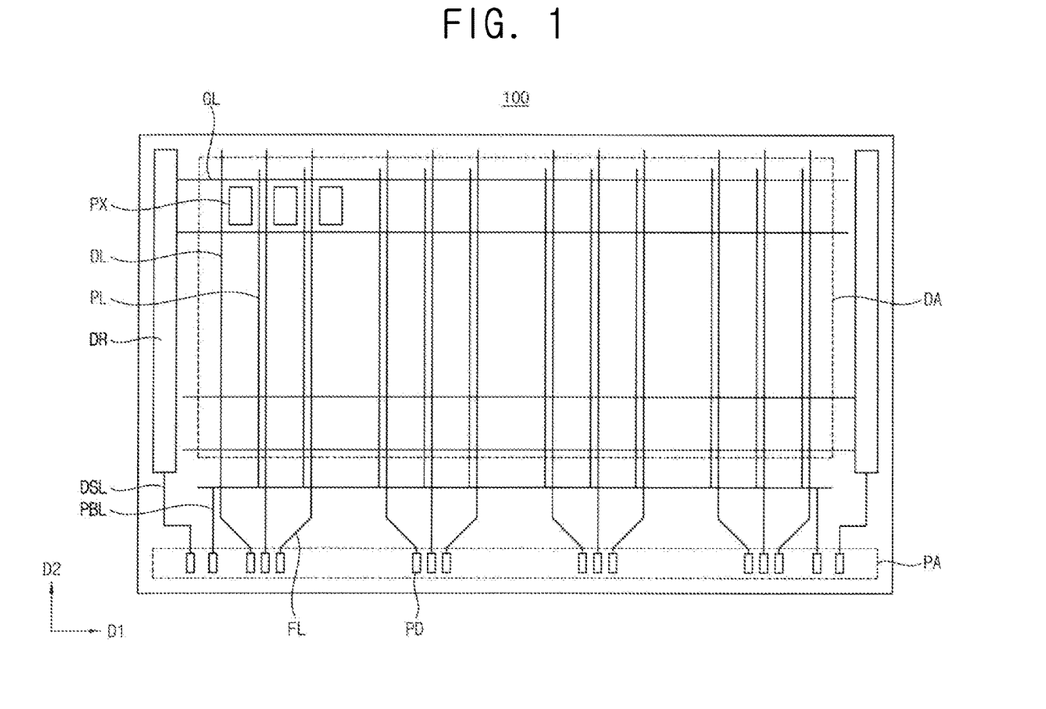
FIG. 1 is a schematic plan view illustrating a display device according to an embodiment.

FIG. 1 is a schematic plan view illustrating a display device according to an embodiment.

Referring to FIG. 1, a display device 100 according to an embodiment may include a display area DA and a peripheral area adjacent to the display area DA. The peripheral area may surround the display area DA. The display area DA may generate a light or may adjust a transmittance of a light provided by an external light source, to display an image. The peripheral area may be defined as a non-display area.

In an embodiment, the display device 100 may include an organic light-emitting display panel. For example, an array of pixels PX, which respectively include a light-emitting element and a driving element, may be disposed in the display area DA to generate a light in response to a driving signal. A signal wiring and a power wiring may be disposed in the display area DA to a driving signal and a power to the pixel PX. For example, a gate line GL, a data line DL and a power line PL may be disposed in the display area DA. The gate line GL may extend in a first direction D1 to transfer a gate signal to the pixel PX. The data line DL may extend in a second direction D2 crossing the first direction D1 to transfer a data signal to the pixel PX. The power line PL may extend in the second direction D2 to transfer a power voltage to the pixel PX.

A circuit part and a transfer wiring may be disposed in the peripheral area. The circuit part may generate a driving signal. The transfer wiring may transfer a driving signal or a power voltage to the display area DA, or may transfer a control signal to the circuit part. For example, a driver DR, a control signal wiring DSL, a fan-our wiring, a power transfer wiring PBL or the like may be disposed in the peripheral area. The driver DR may generate a gate signal. The control signal wiring DSL may transfer the control signal to the driver DR. The fan-out wiring FL may transfer the data signal to the data line DL. The power transfer wiring PBL may transfer the power voltage to the power line PL.

In an embodiment, the peripheral area may include a pad area PA where a connection pad PD may be disposed. For example, the pad area PA may have a shape extending along a side of the display device 100. Connection pads PD may be disposed in the pad area PA.

The transfer wiring may extend into the pad area PA, and may be electrically connected to the connection pad PD. For example, the connection pad PD may be electrically connected to at least one of the control signal wiring DSL, the fan-out wiring FL and the power transfer wiring PBL.

A driving device may be bonded to the connection pad PD. Thus, the transfer wiring may be electrically connected to the driving device to receive the driving signal, the control signal, the power voltage or the like.

For example, the driving device may be a flexible printed circuit board or a printed circuit board, on which a driving chip may be mounted. The driving device may be bonded to (e.g., directly bonded to) the pad area PA, or may be electrically connected to the connection pad PD of the pad area PA through a connection part such as a flexible printed circuit board.

FIGS. 2 to 10 are schematic cross-sectional views illustrating a method for manufacturing a display device according to an embodiment.

Figure 2:
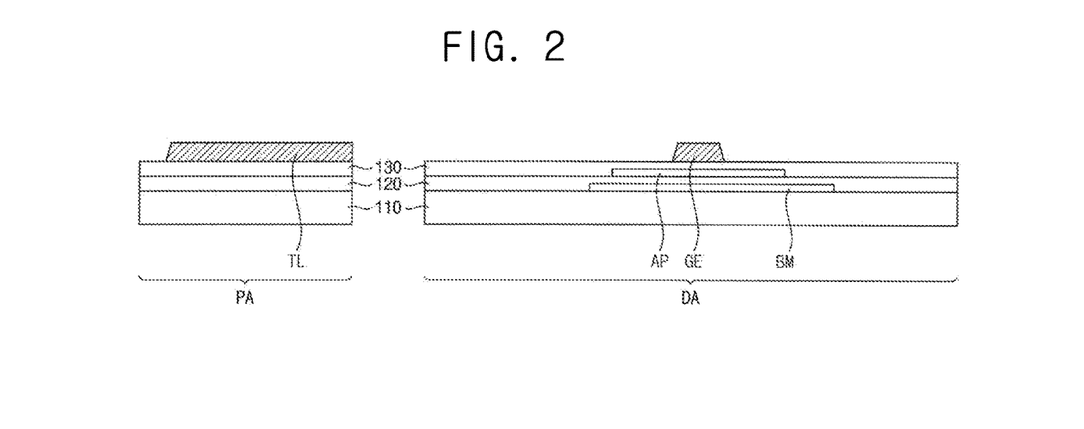
FIGS. 2 to 10 are schematic cross-sectional views illustrating a method for manufacturing a display device according to an embodiment.

Referring to FIG. 2, a bottom metal pattern BM may be formed on a base substrate 110 in a display area DA. A first insulation layer 120 may be formed to cover the bottom metal pattern BM. An active pattern AP may be formed on the first insulation layer 120 in the display area DA. The active pattern AP may overlap the bottom metal pattern BM. A second insulation layer 130 may be formed to cover the active pattern AP. The first insulation layer 120 and the second insulation layer 130 may be formed continuously in the display area DA and the pad area PA. A gate metal pattern may be formed on the second insulation layer 130.

The gate metal pattern may include a gate electrode GE, which may be disposed in the display area DA and overlap the active pattern AP, and a transfer wiring TL, which may be disposed in the pad area PA. For example, the transfer wiring TL may be one of the control signal wiring DSL, the fan-out wiring FL and the power transfer wiring PBL illustrated in FIG. 1, or may be a connection wiring connected thereto.

For example, the base substrate 110 may include glass, quartz, silicon, a polymeric material or a combination thereof.

The first insulation layer 120 may electrically insulate the bottom metal pattern BM from the active pattern AP, and may prevent or reduce penetration of impurities, humidity or external gas from underneath the base substrate 110. The second insulation layer 130 may electrically insulate the active pattern AP from the gate electrode GE. For example, the first insulation layer 120 and the second insulation layer 130 may include silicon oxide, silicon nitride, silicon oxynitride, an insulating metal oxide or a combination thereof, and may have a single-layered structure or a multi-layered structure, respectively. The insulating metal oxide may include aluminum oxide, tantalum oxide, hafnium oxide, zirconium oxide, titanium oxide, or the like or a combination thereof.

For example, the active pattern AP may include a semiconductive material such as amorphous silicon, polycrystalline silicon (polysilicon), a metal oxide, or the like or a combination thereof. In case that the active pattern AP may include polysilicon, at least a portion of the active pattern AP may be doped with impurities such as n-type impurities or p-type impurities.

In an embodiment, the active pattern AP may include a metal oxide semiconductor. For example, the active pattern AP may include two-component compound (ABx), ternary compound (ABxCy) or four-component compound (ABxCyDz), which may contain indium (In), zinc (Zn), gallium (Ga), tin (Sn), titanium (Ti), aluminum (Al), hafnium (Hf), zirconium (Zr), magnesium (Mg) or a combination thereof. For example, the active pattern AP may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), or the like or a combination thereof.

For example, the gate metal pattern may include gold (Au), silver (Ag), aluminum (Al), copper (Cu), nickel (Ni), platinum (Pt), magnesium (Mg), chromium (Cr), tungsten (Al), molybdenum (Mo), titanium (Ti), tantalum (Ta) or an alloy thereof, and may have a single-layered structure or a multi-layered structure including different metal layers. In an embodiment, the gate metal pattern may include at least copper. For example, the gate metal pattern may have a single-layered structure including copper or a multi-layered structure including a copper layer and a titanium layer covering the copper layer.

The bottom metal pattern BM may cover a lower surface of the active pattern AP. The bottom metal pattern BM may block a light entering the active pattern AP to prevent an electrical characteristic of the active pattern AP from being deteriorated. For example, the bottom metal pattern BM may be electrically connected to other wiring to receive a constant voltage.

Figure 3:
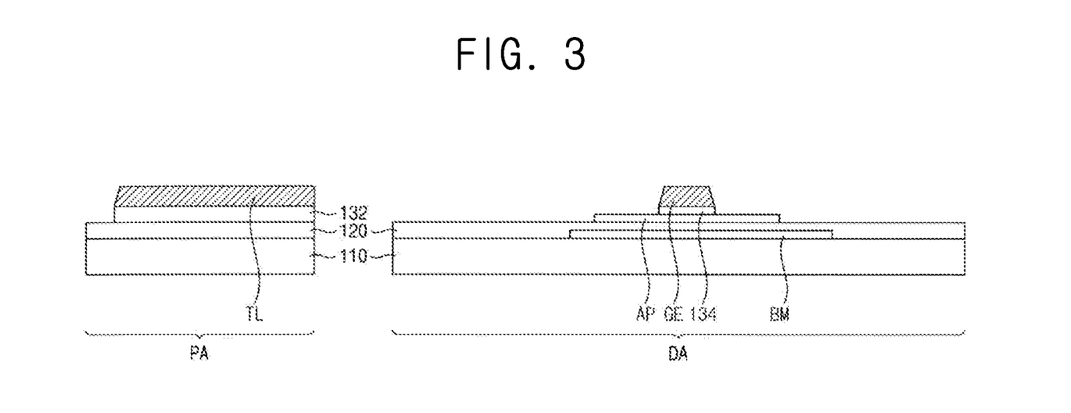

Referring to FIGS. 2 and 3, the second insulation layer 130 may be etched by using the gate metal pattern as a mask to expose a portion of the active pattern AP. As a result, a gate insulation pattern 134 may be formed between the active pattern AP and the gate electrode GE, and a dummy insulation pattern 132 may be formed under the transfer wiring TL. The first insulation layer 120 may be partially etched in the process of etching the second insulation layer 130.

In case that the active pattern AP including a metal oxide may be exposed, a metallic component may be reduced in an exposed portion of the active pattern AP thereby forming a conductive area. A portion of the active pattern AP, which overlaps the gate electrode GE, may define a channel.

Figure 4:
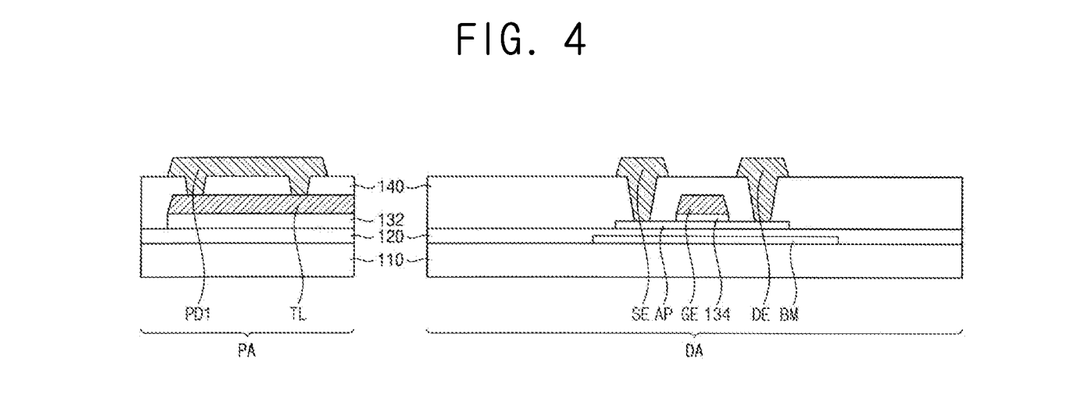

Referring to FIG. 4, a third insulation layer 140 may be formed to cover the gate metal pattern. A source metal pattern may be formed on the third insulation layer 140.

The source metal pattern may include a source electrode SE, a drain electrode DE and a lower pad conductive layer PD1. The source electrode SE may electrically contact the active pattern AP. The drain electrode DE may be spaced apart from the source electrode SE and may electrically contact the active pattern AP. The lower pad conductive layer PD1 may electrically contact the transfer wiring TL. For example, the lower pad conductive layer PD1 may electrically contact the transfer wiring TL through at least one via hole formed through the third insulation layer 140.

For example, the source metal pattern may include gold, silver, aluminum, copper, nickel, platinum, magnesium, chromium, tungsten, molybdenum, titanium, tantalum or an alloy thereof, and may have a single-layered structure or a multi-layered structure including different metal layers. In an embodiment, the source metal pattern may include at least copper. For example, the source metal pattern may have a single-layered structure including copper or a multi-layered structure including a copper layer and a titanium layer covering the copper layer.

For example, the third insulation layer 140 may include silicon oxide, silicon nitride, silicon oxynitride, an insulating metal oxide or a combination thereof, and may have a single-layered structure or a multi-layered structure.

Figure 5:
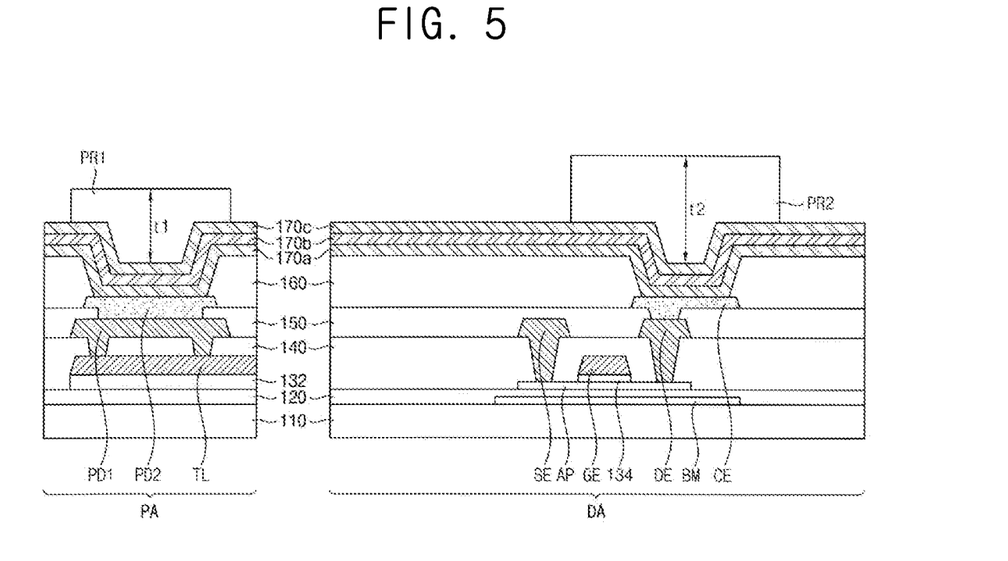

Referring to FIG. 5, a fourth insulation layer 150 may be formed to cover the source metal pattern. A connection metal pattern may be formed on the fourth insulation layer 150. A fifth insulation layer 160 may be formed on the connection metal pattern. A first electrode layer may be formed on the fifth insulation layer 160. A first photoresist pattern PR1 and a second photoresist pattern PR2 may be formed on the first electrode layer.

The fourth insulation layer 150 may partially cover the lower pad conductive layer PD1 in the pad area PA.

The connection metal pattern may include a connection electrode CE and a intermediate pad conductive layer PD2. The connection electrode CE may electrically contact the drain electrode DE. The intermediate pad conductive layer PD2 may electrically contact the lower pad conductive layer PD1.

The connection metal pattern may include a conductive material that has a relatively greater corrosion resistance. For example, the connection metal pattern may include titanium, a metal oxide or a combination thereof, and may have a single-layered structure or a multi-layered structure including different metal layers. For example, the metal oxide may include indium tin oxide, indium zinc oxide or the like or a combination thereof.

The fourth insulation layer 150 may include silicon oxide, silicon nitride, silicon oxynitride, an insulating metal oxide or a combination thereof, and may have a single-layered structure or a multi-layered structure.

The fifth insulation layer 160 may include an organic insulation material, an inorganic insulation material or a combination thereof. For example, the fifth insulation layer 160 may include a phenol resin, an acryl resin, a polyimide resin, a polyamide resin, an epoxy resin, benzocyclobutene, or the like or a combination thereof.

In an embodiment, the first electrode layer may have a multi-layered structure. For example, the first electrode layer may have a multi-layered structure including a metal layer and a metal oxide layer. For example, the first electrode layer may include a lower layer 170a, an intermediate layer 170b and an upper layer 170c. The lower layer 170a and the upper layer 170c may respectively include a metal oxide, and the intermediate layer 170b may include a metal.

For example, the lower layer 170a and the upper layer 170c may respectively include indium tin oxide, indium zinc oxide, zinc tin oxide, indium oxide, zinc oxide, tin oxide or a combination thereof. In an embodiment, the lower layer 170a and the upper layer 170c may respectively include indium tin oxide.

The intermediate layer 170b may include gold, silver, aluminum, copper, nickel, platinum, magnesium, chromium, tungsten, molybdenum, titanium or an alloy thereof. In an embodiment, the intermediate layer 170b may include silver.

The first photoresist pattern PR1 may overlap the intermediate pad conductive layer PD2. The second photoresist pattern PR2 may overlap the connection electrode CE. In an embodiment, a thickness t2 of the second photoresist pattern PR2 may be smaller than a thickness t1 of the first photoresist pattern PR1. The photoresist pattern having a thickness variation may be formed by half-tone light exposure or the like.

Figure 6:
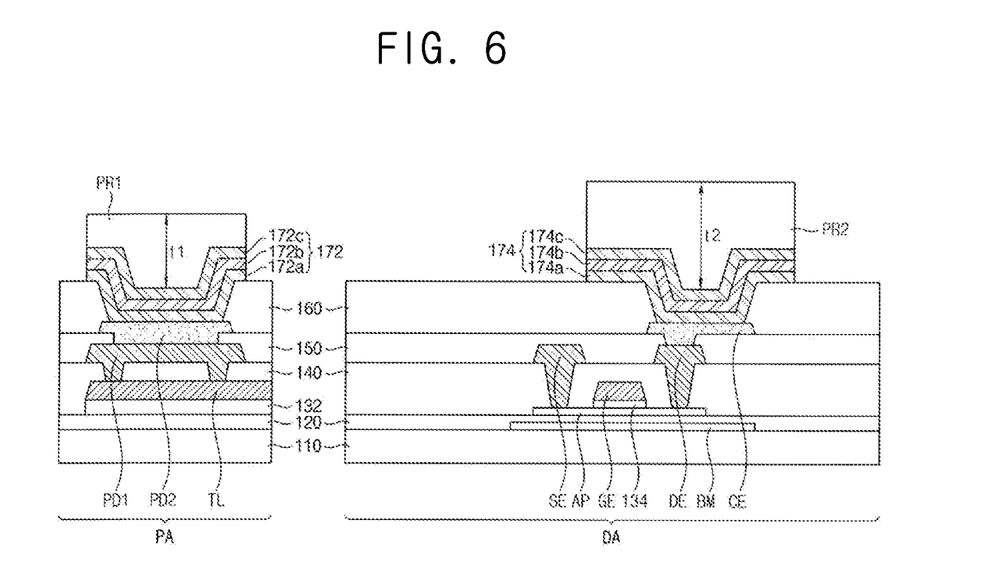

Referring to FIG. 6, the first electrode layer may be etched by using the first and second photoresist patterns PR1 and PR2 as a mask. As a result, a first remaining pattern 172 may be formed under the first photoresist pattern PR1, and a second remaining pattern 174 may be formed under the second photoresist pattern PR2.

The first remaining pattern 172 and the second remaining pattern 174 may respectively include a lower layer 172a and 174a, an intermediate layer 172b and 174b and an upper layer 172c and 174c. The first remaining pattern 172 may electrically contact the intermediate pad conductive layer PD2. The second remaining pattern 174 may electrically contact the connection electrode CE. The second remaining pattern 174 may define a first electrode of an organic light-emitting diode.

Figure 7:
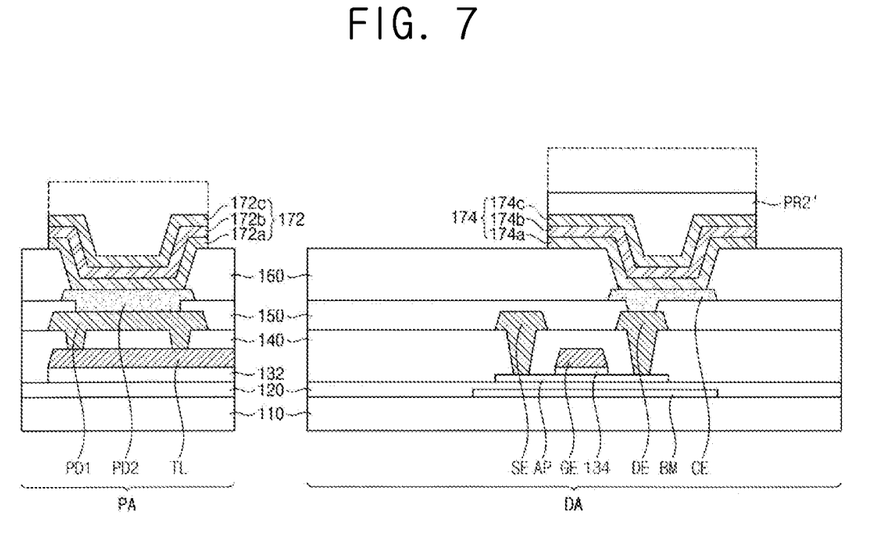

Referring to FIG. 7, an etch-back process such as an ashing process may be performed to remove the first photoresist pattern PR1 and a portion of the second photoresist pattern PR2. Since the second photoresist pattern PR2 may have a thickness greater than a thickness of the first photoresist pattern PR1, the second photoresist pattern PR2 may partially remain to form a remaining photoresist pattern PR2'.

Figure 8:
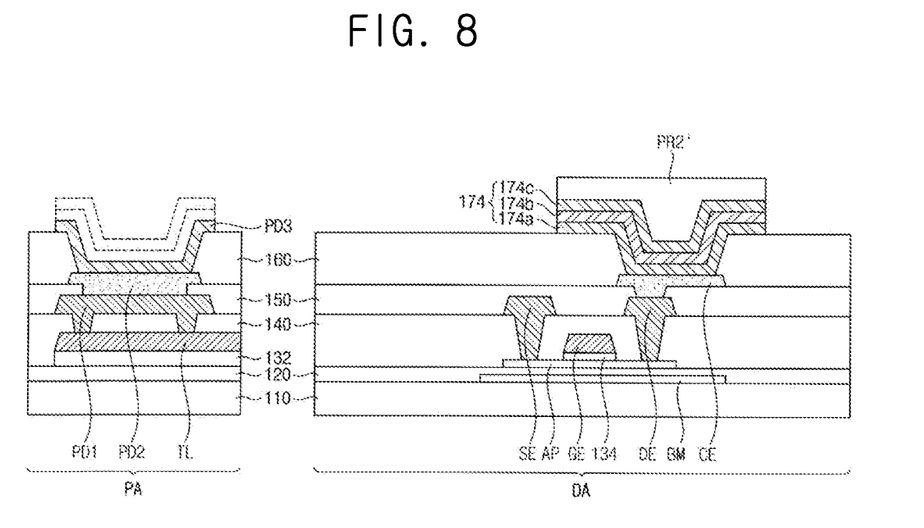

Referring to FIGS. 7 and 8, the upper layer 172c and the lower layer 172b of the first remaining pattern 172 may be removed. In an embodiment, the upper layer 172c and the lower layer 172b of the first remaining pattern 172 may be removed by a wet etching process.

For example, the upper layer 172 including indium tin oxide may be etched by a first etching composition including nitric acid, a chloride compound, an ammonium compound, a cyclic amine compound, and water or a combination thereof.

The chloride compound may include sodium chloride, potassium chloride, ammonium chloride or a combination thereof.

The ammonium compound may include ammonium acetate, ammonium sulfamate, ammonium benzenediol, ammonium carbamate, ammonium dihydrogen phosphate, ammonium formate, ammonium bicarbonate, ammonium citrate, ammonium nitrate, ammonium persulfate, ammonium sulphamate, ammonium sulfate or a combination thereof.

The cyclic amine compound may include benzotriazole, 5-aminotetrazole, 3-aminotetrazole, 5-methyltetrazole or a combination thereof.

The intermediate layer 172b including silver may be etched by a second etching composition including an inorganic acid, an organic acid that may contain a carboxyl group, methane sulfonic acid, a glycolic acid, imidazolidine-2,4-dione, pyroglutamic acid, and a nitrate or a combination thereof.

Since the second remaining pattern 174 may be covered by the remaining photoresist pattern PR2', the second remaining pattern 174 may not be etched when the upper layer 172c and the intermediate layer 172b of the first remaining pattern 172 may be etched.

In an embodiment, the intermediate layer 172b of the first remaining pattern 172 may include a metal such as silver, which has a relatively low corrosion resistance. Thus, in case that the first remaining pattern 172 may be entirely used for a connection pad, reliability of a display device may be reduced by corrosion of the connection pad.

In case that the first remaining pattern 172 may be entirely removed, an etching composition may penetrate into the lower pad conductive layer PD1 through a pore in the intermediate pad conductive layer PD2 if the first remaining pattern 172 may be removed. In an embodiment, the lower pad conductive layer PD1 may include copper, which has a relatively low corrosion resistance and may be easily corroded by the etching composition used for etching indium tin oxide.

In an embodiment, the lower layer of the first electrode layer may remain in the pad area PA. Thus, damage or corrosion of the pad conductive layer including copper may be prevented.

Furthermore, a remaining pattern may be formed in the pad area PA from the first electrode layer using half-tone light exposure or the like without an additional photolithography process.

The lower layer of the first remaining pattern 172 may define an upper pad conductive layer PD3. Thus, the upper pad conductive layer PD3 may have a single-layered structure including a metal oxide.

Figure 9:
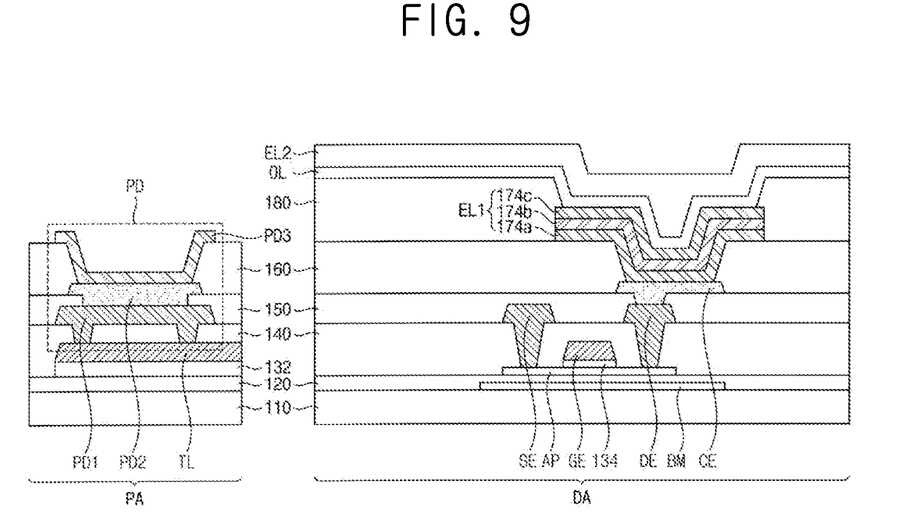

Referring to FIG. 9, a pixel-defining layer 180 may be formed on the fifth insulation layer 160. The pixel-defining layer 180 may include an opening overlapping at least a portion of a first electrode EL1 defined by the second remaining pattern. An organic light-emitting layer OL may be formed on the first electrode EL1. A second electrode EL2 may be formed on the organic light-emitting layer OL. The first electrode EL1 may function an anode, and the second electrode EL2 may function as a cathode.

An upper surface of the upper pad conductive layer PD3 may be exposed. The lower pad conductive layer PD1, the intermediate pad conductive layer PD2 and the upper pad conductive layer PD3 may define a connection pad PD. However, the above configuration of the connection pad PD may be arbitrarily defined, and embodiments are not limited thereto. For example, a connection pad PD may be defined by the upper pad conductive layer PD3.

In an embodiment, the organic light-emitting layer OL may include at least one common layer continuously extending over an upper surface of the first electrode EL1 and an upper surface of the pixel-defining layer 180. However, embodiments are not limited thereto. For example, a display device may include an organic light-emitting layer having an isolated pattern shape corresponding to a single pixel or multiple pixels.

The organic light-emitting layer OL may include at least a light-emitting layer, and may further include at least one of a hole injection layer (HIL), a hole transporting layer (HTL), an electron transporting layer (ETL) and an electron injection layer (EIL). For example, the organic light-emitting layer OL may include a low molecular weight organic compound or a high molecular weight organic compound.

In an embodiment, the organic light-emitting layer OL may emit a red light, a green light or a blue light. In another embodiment, the organic light-emitting layer OL may emit a white light. The organic light-emitting layer OL emitting a white light may have a multi-layered structure including a red-emitting layer, a green-emitting layer and a blue-emitting layer, or a single-layer structure including a mixture of a red-emitting material, a green-emitting material and a blue-emitting material.

The second electrode EL2 may be formed as a common layer extending entirely over the display area DA.

For example, in case that the second electrode EL2 is a transmitting electrode, the second electrode EL2 may include lithium (Li), calcium (Ca), lithium fluoride, aluminum, magnesium, indium tin oxide, indium zinc oxide, zinc tin oxide, indium oxide, zinc oxide, tin oxide or a combination thereof.

Figure 10:
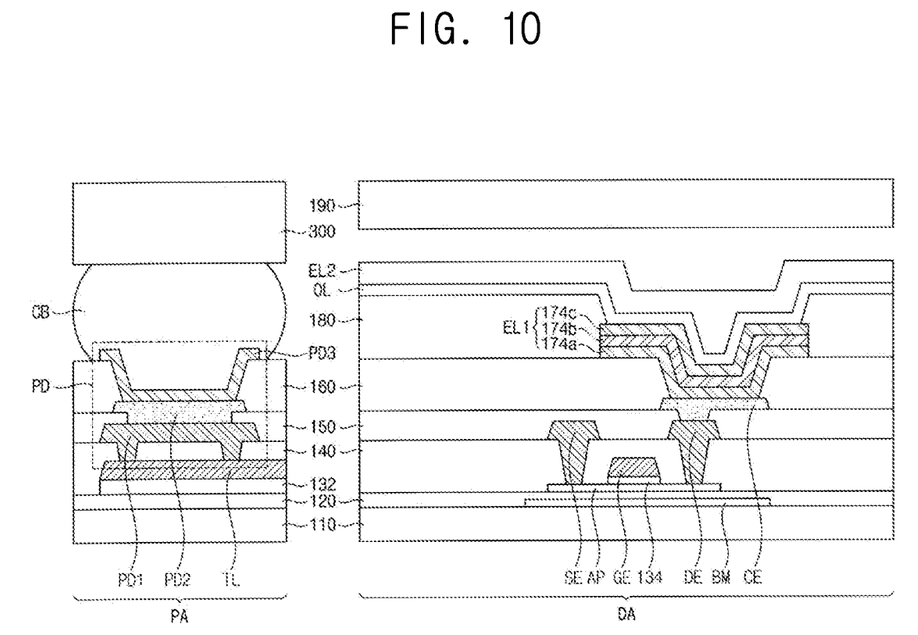

Referring to FIG. 10, a cover substrate 190 may be disposed on the organic light-emitting diode. The cover substrate 190 may include glass, quartz, silicon, a polymeric material or a combination thereof. A space between the cover substrate 190 and the organic light-emitting diode may be maintained as a vacuum state, or may be filled with a filling.

In another embodiment, a display device may include an encapsulation layer covering the organic light-emitting diode instead of the cover substrate 190. For example, the encapsulation layer may have a stacked structure of an organic thin film and an inorganic thin film.

A driving device 300 may be bonded to the connection pad PD. For example, the driving device 300 may be bonded and electrically connected to the connection pad PD through a conductive bonding part CB. Thus, a driving signal, a power voltage or the like may be transferred to a driver disposed in the peripheral area or a driving element disposed in the display area through the connection pad PD and the transfer wiring TL.

For example, the conductive bonding part CB may include a metal bump, an anisotropic conductive film, or a combination thereof. The driving device 300 may include a flexible printed circuit board with a driving chip mounted thereon, a printed circuit board with a driving chip mounted thereon, a connector connected thereto or the like.

In an embodiment, the upper pad conductive layer PD3 of the connection pad PD may contact the conductive bonding part CB.

According to embodiments, a portion of an anode layer may remain in a pad area to protect a pattern disposed under a remaining pattern. Furthermore, a metal layer having a relatively low corrosion resistance may be removed in an area where a connection pad may be exposed. Thus, it may be prevented that reliability of a display device is reduced by corrosion of the connection pad.

FIGS. 11 to 14 are schematic cross-sectional views illustrating a method for manufacturing a display device according to an embodiment.

Figure 11:
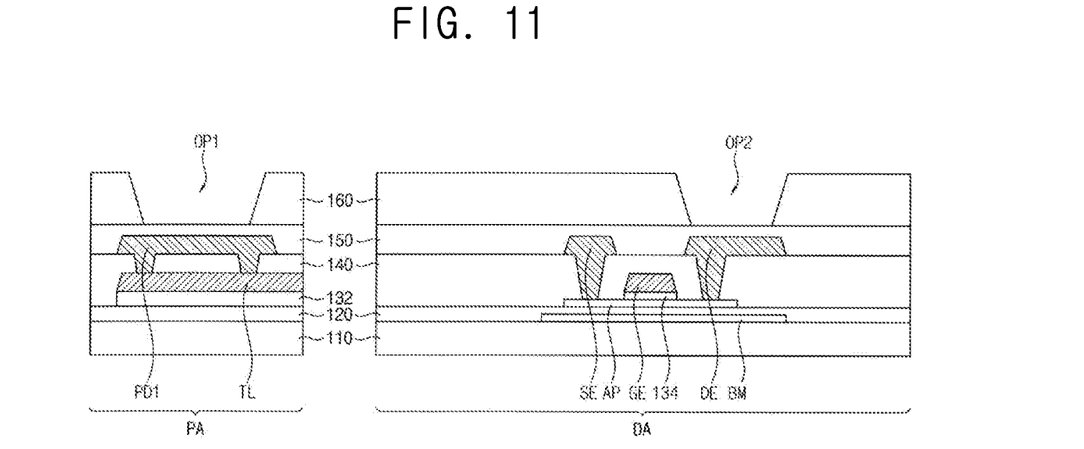
FIGS. 11 to 14 are schematic cross-sectional views illustrating a method for manufacturing a display device according to an embodiment.

Referring to FIG. 11, a bottom metal pattern BM may be formed on a base substrate 110 in a display area DA. A first insulation layer 120 may be formed to cover the bottom metal pattern BM. An active pattern AP may be formed on the first insulation layer 120 in the display area DA. The active pattern AP may overlap the bottom metal pattern BM. A gate metal pattern including a gate electrode GE and a transfer wiring TL may be formed. A gate insulation pattern 134 and a dummy insulation pattern 132 may be formed between the gate electrode GE and the active pattern AP and between the transfer wiring TL and the insulation layer 120, respectively. A third insulation layer 140 may be formed to cover the gate metal pattern. A source metal pattern including a source electrode SE, a drain electrode DE and a lower pad conductive layer PD1 may be formed on the third insulation layer 140. The lower pad conductive layer PD1 may be disposed in a pad area PA. A fourth insulation layer 150 may be formed to cover the source metal pattern. A fifth insulation layer 160 may be formed on the fourth insulation layer 150. The fifth insulation layer 160 may include a first opening area OP1 overlapping the lower pad conductive layer PD1 and a second opening area OP2 overlapping the drain electrode DE.

Figure 12:
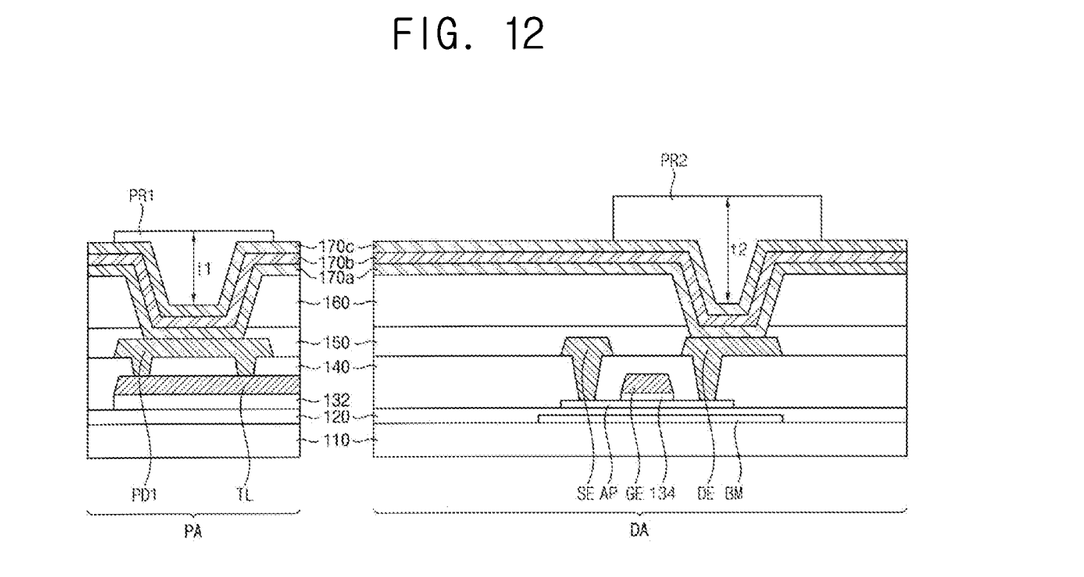

Referring to FIGS. 11 and 12, the fourth insulation layer 150 exposed through the first and second opening areas OP1 and OP2 may be etched to expose a lower pad conductive layer PD1 and the drain electrode DE.

Thereafter, a first electrode layer may be formed on the fifth insulation layer 160. A first photoresist pattern PR1 and a second photoresist pattern PR2 may be formed on the first electrode layer.

In an embodiment, the first electrode layer may include a lower layer 170a, an intermediate layer 170b and an upper layer 170c. For example, the lower layer 170a and the upper layer 170c may include indium tin oxide, and the intermediate layer 170b may include silver.

The first photoresist pattern PR1 may overlap the lower pad conductive layer PD1. The second photoresist pattern PR2 may overlap the drain electrode DE. In an embodiment, a thickness t2 of the second photoresist pattern PR2 may be greater than a thickness t1 of the first photoresist pattern PR1.

Figure 13:
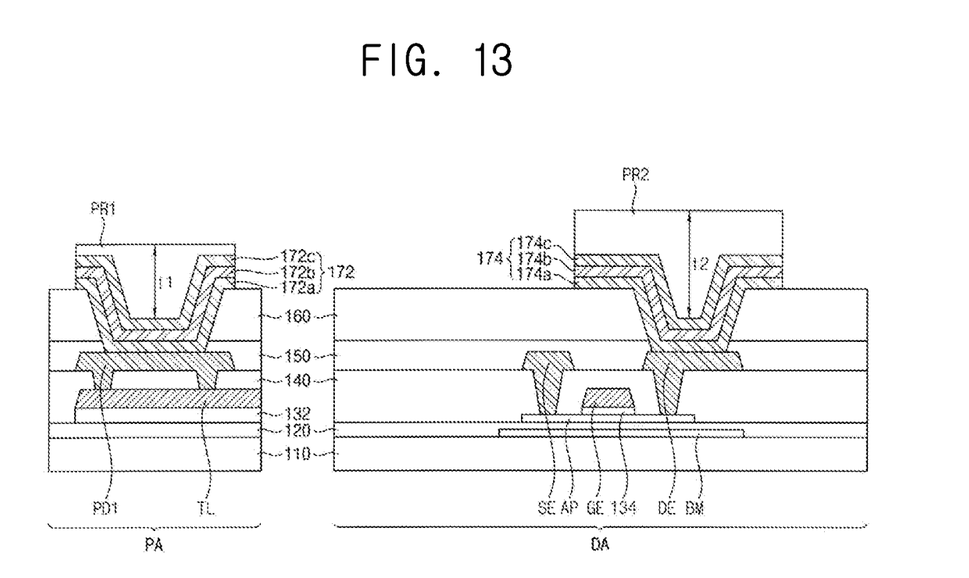

Referring to FIG. 13, the first electrode layer may be etched by using the first photoresist pattern PR1 and the second photoresist pattern PR2 as a mask. As a result, a first remaining pattern 172 may be formed under the first photoresist pattern PR1, and a second remaining pattern 174 may be formed under the second photoresist pattern PR2.

The first remaining pattern 172 and the second remaining pattern 174 may include a lower layer 172a and 174a, an intermediate layer 172b and 174b and an upper layer 172c and 174c, respectively. The first remaining pattern 172 may electrically contact the lower pad conductive layer PD1. The second remaining pattern 174 may electrically contact the drain electrode DE. The second remaining pattern 174 may define a first electrode of an organic light-emitting diode.

Figure 14:
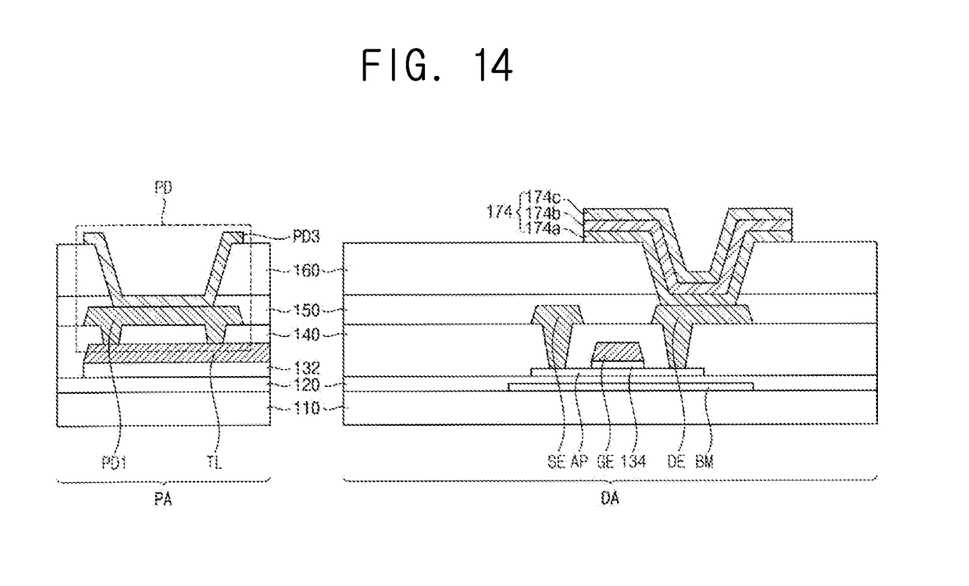

Referring to FIGS. 13 and 14, the first photoresist pattern PR1 may be removed through an etch-back process such as an ashing process. Thereafter, the upper layer 172c and the intermediate layer 172b of the first remaining pattern 172 may be removed. Thereafter, a remaining photoresist pattern disposed on the second remaining pattern 174 may be removed.

The lower layer of the first remaining pattern 172 may remain and define an upper pad conductive layer PD3 of a connection pad PD.

In an embodiment, the lower pad conductive layer PD1 may be protected by the upper pad conductive layer PD3. As the above, an intermediate pad conductive layer may be omitted from a connection pad, as desired.

FIGS. 15 to 18 are schematic cross-sectional views illustrating a method for manufacturing a display device according to an embodiment.

Figure 15:
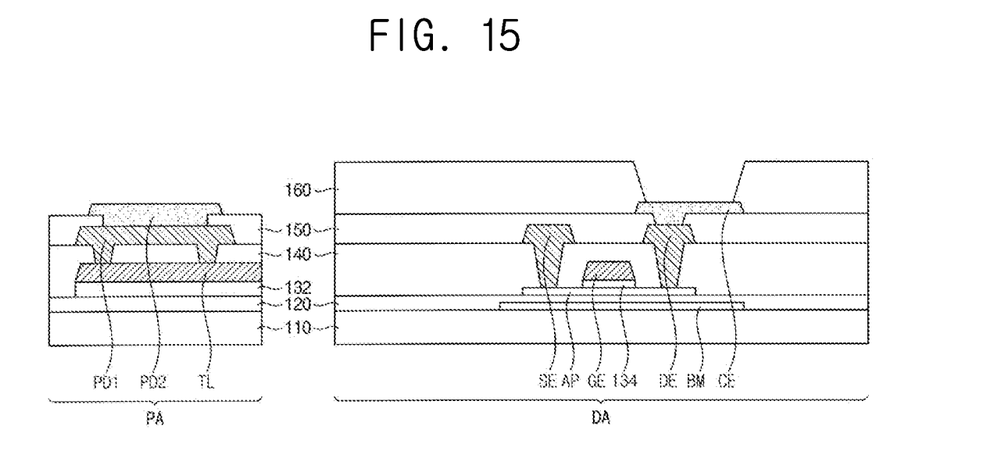
FIGS. 15 to 18 are schematic cross-sectional views illustrating a method for manufacturing a display device according to an embodiment.

Referring to FIG. 15, a bottom metal pattern BM may be formed on a base substrate 110 in a display area DA. A first insulation layer 120 may be formed to cover the bottom metal pattern BM. An active pattern AP may be formed on the first insulation layer 120 in the display area DA. The active pattern AP may overlap the bottom metal pattern BM. A gate metal pattern including a gate electrode GE and a transfer wiring TL may be formed. A gate insulation pattern 134 and a dummy insulation pattern 132 may be formed between the gate electrode GE and the active pattern AP and between the transfer wiring TL and the insulation layer 120, respectively. A third insulation layer 140 may be formed to cover the gate metal pattern. A source metal pattern including a source electrode SE, a drain electrode DE and a lower pad conductive layer PD1 may be formed on the third insulation layer 140. The lower pad conductive layer PD 1 may be disposed in a pad area PA. A fourth insulation layer 150 may be formed to cover the source metal pattern. A connection metal pattern may be formed on the fourth insulation layer 150. The connection metal pattern may include a connection electrode CE, which may electrically contact the drain electrode DE, and an intermediate pad conductive layer PD2, which may electrically contact the lower pad conductive layer PD1. A fifth insulation layer 160 may be formed on the fourth insulation layer 150. The fifth insulation layer 160 include an opening area exposing the connection electrode CE, and may not be disposed in the pad area PA.

Figure 16:
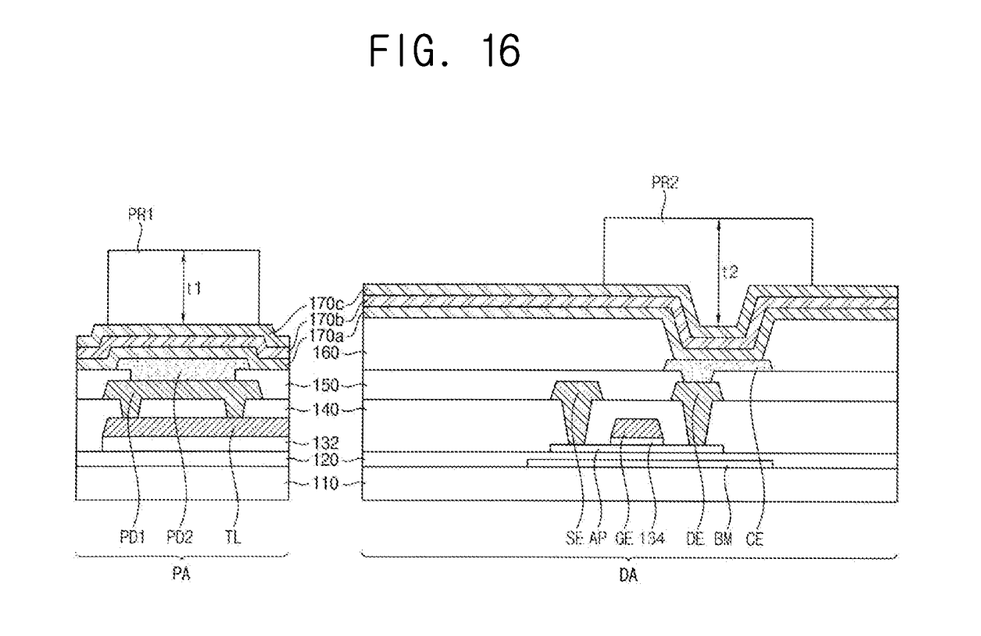

Referring to FIG. 16, a first electrode layer may be formed on the fifth insulation layer 160. A first photoresist pattern PR1 and a second photoresist pattern PR2 may be formed on the first electrode layer.

In an embodiment, the first electrode layer may include a lower layer 170a, an intermediate layer 170b and an upper layer 170c. For example, the lower layer 170a and the upper layer 170c may include indium tin oxide, and the intermediate layer 170b may include silver.

The first photoresist pattern PR1 may overlap the lower pad conductive layer PD1. The second photoresist pattern PR2 may overlap the drain electrode DE. In an embodiment, a thickness t2 of the second photoresist pattern PR2 may be greater than a thickness t1 of the first photoresist pattern PR1.

Figure 17:
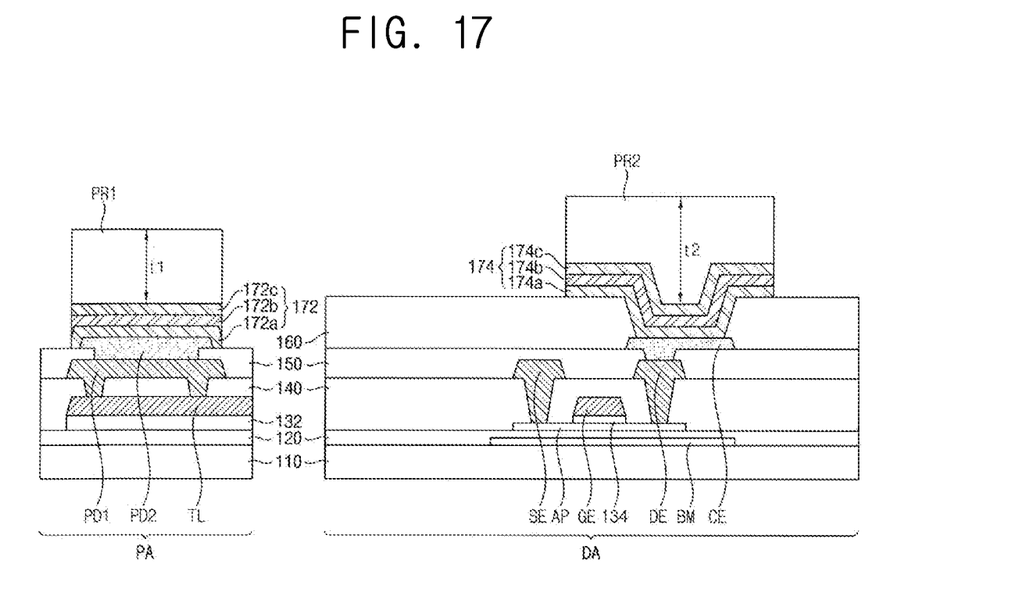

Referring to FIG. 17, the first electrode layer may be etched by using the first photoresist pattern PR1 and the second photoresist pattern PR2 as a mask. As a result, a first remaining pattern 172 may be formed under the first photoresist pattern PR1, and a second remaining pattern 174 may be formed under the second photoresist pattern PR2.

The first remaining pattern 172 and the second remaining pattern 174 may include a lower layer 172a and 174a, an intermediate layer 172b and 174b and an upper layer 172c and 174c, respectively. The first remaining pattern 172 may electrically contact the intermediate pad conductive layer PD2. The second remaining pattern 174 may electrically contact the connection electrode CE. The second remaining pattern 174 may define a first electrode of an organic light-emitting diode.

Figure 18:
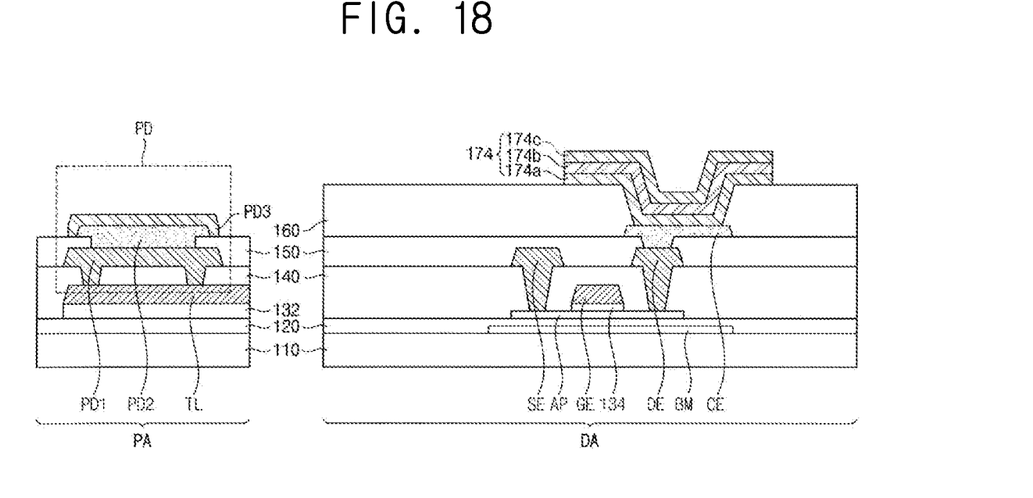

Referring to FIGS. 17 and 18, the first photoresist pattern PR1 may be removed through an etch-back process such as an ashing process. Thereafter, the upper layer 172c and the intermediate layer 172b of the first remaining pattern 172 may be removed. Thereafter, a remaining photoresist pattern disposed on the second remaining pattern 174 may be removed.

The lower layer of the first remaining pattern 172 may remain and define an upper pad conductive layer PD3 of a connection pad PD.

In an embodiment, a fifth insulation layer 160 including an organic material may not be formed in the pad area PA. Thus, a bonding defect due to humidity absorption of an organic insulation layer or the like may be prevented.

Embodiments may be applied to various display devices. For example, embodiments may be applied to a vehicle-display device, a ship-display device, an aircraft-display device, portable communication devices, display devices for display or for information transfer, a medical-display device, etc.

The foregoing is illustrative of embodiments and is not to be construed as limiting thereof. Although embodiments have been described, those skilled in the art will readily appreciate that many modifications are possible in the embodiments without materially departing from the novel teachings and aspects of the inventive concept. Accordingly, all such modifications are intended to be included within the scope of the inventive concept. Therefore, it is to be understood that the foregoing is illustrative of various embodiments and is not to be construed as limited to the specific embodiments disclosed, and that modifications to the disclosed embodiments, as well as other embodiments, are intended to be included within the scope of the inventive concept, as set forth in the following claims and equivalents thereof.

What is claimed is:

1. A display device comprising:
a pixel array disposed in a display area;
a connection pad disposed in a pad area; and
a transfer wiring electrically connected to the connection pad to transfer a signal to the pixel array, wherein
the pixel array includes a light-emitting element including:
a first electrode including a multi-layered structure including a metal layer and a metal oxide layer;
an organic light-emitting layer disposed on the first electrode; and
a second electrode disposed on the organic light-emitting layer, and
the connection pad includes an upper pad conductive layer having a single-layered structure including a metal oxide,
the metal oxide layer of the first electrode of the light-emitting element is a lower layer of the light-emitting element, and
the lower layer of the light-emitting element and the upper pad conductive layer are of a same layer.

2. The display device of claim 1, wherein the signal comprises at least one of a driving signal and a power voltage.

3. The display device of claim 1, wherein the connection pad further includes a lower pad conductive layer disposed under the upper pad conductive layer, the lower pad conductive layer including copper.

4. The display device of claim 3, wherein the connection pad further includes an intermediate pad conductive layer disposed between the upper pad conductive layer and the lower pad conductive layer.

5. The display device of claim 4, further comprising:
an insulation layer disposed under the upper pad conductive layer, wherein
the upper pad conductive layer passes through the insulation layer to electrically contact the intermediate pad conductive layer; and
the intermediate pad conductive layer includes at least one selected from the group of titanium and a metal oxide.

6. The display device of claim 1, wherein the metal layer of the first electrode includes silver.

7. The display device of claim 1, wherein the upper pad conductive layer may include at least one selected from the group of indium tin oxide, indium zinc oxide, zinc tin oxide, indium oxide, zinc oxide and tin oxide.

8. The display device of claim 1, further including an insulation layer disposed under the upper pad conductive layer, the insulation layer including an inorganic material.

9. The display device of claim 1, further comprising a driver bonded to the connection pad.

10. The display device of claim 9, wherein the connection pad is electrically connected to the driver by a conductive bonding part.

11. A display device comprising:
a pixel array disposed in a display area; and
a connection pad disposed in a pad area and electrically connected to the pixel array,
wherein
the pixel array includes a light-emitting element including:
a first electrode including a multi-layered structure including a metal layer and a metal oxide layer;
an organic light-emitting layer disposed on the first electrode; and
a second electrode disposed on the organic light-emitting layer, and the connection pad includes:
a lower pad conductive layer including copper; and
an upper pad conductive layer disposed on the lower pad conductive layer, the upper pad conductive layer having a single-layered structure including a metal oxide,
the metal oxide layer of the light-emitting element is a lower layer of the light-emitting element, and
the lower layer of the light-emitting element and the upper pad conducive layer are of a same layer.

12. The display device of claim 11, wherein the connection pad further includes an intermediate pad conductive layer disposed between the upper pad conductive layer and the lower pad conductive layer.

13. The display device of claim 12, wherein the intermediate pad conductive layer includes at least one selected from the group of titanium and a metal oxide.

14. A method for manufacturing a display device including a pixel array disposed in a display area and a connection pad disposed in a pad area, the method comprising:
forming a first electrode layer in the display area and the pad area, the first electrode layer including a lower layer including a metal oxide, an intermediate layer including a metal, and an upper layer including a metal oxide;
forming a first photoresist pattern on the first electrode layer in the pad area;
forming a second photoresist pattern on the first electrode layer in the display area, a thickness of the second photoresist pattern being greater than a thickness of the first photoresist pattern;
etching the first electrode layer to form a first remaining pattern under the first photoresist pattern and a second remaining pattern under the second photoresist pattern, the first and second remaining patterns respectively including a lower layer, an intermediate layer and an upper layer;
removing the first photoresist pattern and a portion of the second photoresist pattern to form a remaining photoresist pattern;
removing an upper layer and an intermediate layer of the first remaining pattern; and
removing the remaining photoresist pattern.

15. The method of claim 14, wherein
the second remaining pattern defines a first electrode of the light-emitting element, and
the lower layer of the first remaining pattern defines an upper conductive pad layer of the connection pattern.

16. The method of claim 15, further comprising:
forming a source metal pattern including a lower pad conductive layer, a source electrode and a drain electrode before forming the first electrode layer,
the lower pad conductive layer is electrically connected to the upper conductive pad layer, and
the drain electrode is electrically connected to the first electrode.

17. The method of claim 16, wherein the source metal pattern includes copper.

18. The method of claim 16, further comprising forming a connection electrode pattern including an intermediate pad conductive layer and a connection electrode after forming the source metal pattern, wherein the intermediate pad conductive layer electrically contacts the lower pad conductive layer and the upper pad conductive layer, and the connection electrode electrically contact the drain electrode and the first electrode.

19. The method of claim 18, wherein the connection electrode pattern includes at least one selected from the group of titanium and a metal oxide.

20. The method of claim 14, wherein the lower layer of the first remaining pattern includes at least one selected from the group of indium tin oxide, indium zinc oxide, zinc tin oxide, indium oxide, zinc oxide and tin oxide.

21. The method of claim 14, wherein the metal layer of the first electrode layer includes silver.

* * * * *